US012563697B2

(12) United States Patent
Blennius

(10) Patent No.: US 12,563,697 B2
(45) Date of Patent: Feb. 24, 2026

(54) COOLING SYSTEM OF AN ELECTRONIC MODULE WITH A LEAKAGE CONTROL DEVICE

(71) Applicant: SAAB AB, Linköping (SE)

(72) Inventor: Martin Blennius, Kullavik (SE)

(73) Assignee: SAAB AB, Linköping (SE)

( * ) Notice: Subject to any disclaimer, the term of this patent is extended or adjusted under 35 U.S.C. 154(b) by 226 days.

(21) Appl. No.: 18/256,284

(22) PCT Filed: Dec. 8, 2021

(86) PCT No.: PCT/SE2021/051219
§ 371 (c)(1),
(2) Date: Jun. 7, 2023

(87) PCT Pub. No.: WO2022/124970
PCT Pub. Date: Jun. 16, 2022

(65) Prior Publication Data
US 2024/0107707 A1     Mar. 28, 2024

(30) Foreign Application Priority Data

Dec. 9, 2020    (SE) .................................... 2000226-7

(51) Int. Cl.
*H05K 7/20*          (2006.01)
*H01Q 1/02*          (2006.01)
(52) U.S. Cl.
CPC ........... *H05K 7/20272* (2013.01); *H01Q 1/02* (2013.01)

(58) Field of Classification Search
None
See application file for complete search history.

(56) References Cited

U.S. PATENT DOCUMENTS 8,654,532 B2 *  2/2014  Chen .................. H05K 7/20781
                                                                361/689
9,961,800 B2 *  5/2018  Jin ..................... H05K 7/20509
(Continued)

FOREIGN PATENT DOCUMENTS

EP          1317774 A2       6/2003
JP        2005-026361 A      1/2005
(Continued)

OTHER PUBLICATIONS

International Search Report and Written Opinion mailed May 24, 2022 for International Application No. PCT/SE2021/051219, 15 pages.
(Continued)

*Primary Examiner* — Courtney L Smith
(74) *Attorney, Agent, or Firm* — Sage Patent Group

(57)     ABSTRACT

A system for controlling the cooling of an electronic module is disclosed, the system including an electronic module extending in a first and a second direction, a cooling pipe structure and a leakage device. The cooling pipe structure is arranged to transfer a flow of cooling medium, so to cool the electronic module, wherein the cooling pipe structure further includes a muzzle extending outwardly from a circumferential portion of said cooling pipe structure and a coupling portion being mated with an open end of the muzzle wherein
(Continued)

said leakage device includes a leak collecting means circumferentially enclosing a mating interface of the muzzle and the coupling portion, so to collect any leakage from the cooling pipe structure.

10 Claims, 14 Drawing Sheets

(56)                References Cited

U.S. PATENT DOCUMENTS

| | | | | |
|---|---|---|---|---|
| 10,638,645 | B1 * | 4/2020 | Moen | G21C 15/182 |
| 10,863,652 | B1 * | 12/2020 | Conroy | H05K 7/20763 |
| 11,711,908 | B1 * | 7/2023 | Gao | H05K 7/20781 |
| | | | | 361/688 |
| 11,980,006 | B2 * | 5/2024 | Gao | H05K 7/20254 |
| 12,216,025 | B2 * | 2/2025 | Gao | H05K 7/20254 |
| 2006/0171117 | A1 | 8/2006 | Hamman | |
| 2016/0270267 | A1 | 9/2016 | Chainer et al. | |
| 2016/0273996 | A1 | 9/2016 | Alshinnawi et al. | |
| 2017/0181329 | A1 | 6/2017 | Shelnutt et al. | |
| 2022/0312645 | A1 * | 9/2022 | Gao | G01M 3/165 |
| 2022/0390195 | A1 * | 12/2022 | Gao | G01M 3/02 |
| 2023/0066006 | A1 * | 3/2023 | Gao | H05K 7/20781 |
| 2023/0067321 | A1 * | 3/2023 | Gao | H05K 7/20272 |
| 2024/0032243 | A1 * | 1/2024 | Matteson | H05K 7/20263 |

FOREIGN PATENT DOCUMENTS

| | | |
|---|---|---|
| WO | 0223966 A2 | 3/2002 |
| WO | 2019/148701 A1 | 8/2019 |

OTHER PUBLICATIONS

Written Opinion of the International Preliminary Examining Authority mailed Jan. 2, 2023 for International Application No. PCT/SE2021/051219, 8 pages.

International Preliminary Report on Patentability (IPRP) of the International Preliminary Examining Authority mailed Mar. 29, 2023 for International Application No. PCT/SE2021/051219, 9 pages.

Office Action mailed Apr. 28, 2025 for United Arab Emirates Patent Application No. P6001370/2023, 8 pages.

Office Action mailed Oct. 23, 2025 for Israeli Patent Application No. 303412, 3 pages.

Office Action mailed Oct. 20, 2025 for Korean Patent Application No. 10-2023-7021391, 12 pages (includes English translation).

* cited by examiner

100

300

111

140 y1 x1

COOLING SYSTEM OF AN ELECTRONIC MODULE WITH A LEAKAGE CONTROL DEVICE

CROSS-REFERENCE TO RELATED APPLICATIONS

This application is a 35 U.S.C § 371 national stage application for International Application No. PCT/SE2021/051219, entitled "COOLING SYSTEM OF AN ELECTRONIC MODULE WITH A LEAKAGE CONTROL DEVICE", filed on Dec. 8, 2021, which claims priority to Swedish Patent Application No. 2000226-7, filed on Dec. 9, 2020, the disclosures and contents of which are hereby incorporated by reference in their entireties.

TECHNICAL FIELD

The present disclosure relates to a system for controlling the cooling of an electronic module, the system comprising an electronic module, a cooling pipe structure and a leakage device.

BACKGROUND ART

It is well known that electronic modules e.g. antenna modules include components that produce heat. There exist various types of cooling systems to remove heat from antenna modules to maintain the antenna module within operating temperature limits.

The cooling of antenna modules need to fulfil certain requirements in order to allow the antenna module to perform optimally. Such requirements can include providing a cooling structure having a low weight, being convenient to assemble and demount, being compact and being positioned close to the electronic components for a more efficient cooling.

One specific type of cooling structure that can be applied for antenna modules beneficially is a proximity cooling structure that provides a cooling medium that flows proximate the antenna module to allow for an efficient heat transfer. This allows for the heat in the antenna module to be absorbed by the cooling medium flowing proximate the antenna module.

This type of cooling structures incorporating a cooling medium proximate electronic components has several drawbacks. One drawback is that there is a risk of leakage of liquid from the cooling structure which may damage the electronic components on the electronic module. The risk for leakage is at its highest at the clutches of the cooling structure. The clutches are required in the cooling structure to allow for assembly, and demounting of the cooling structure so to allow for convenient serving, maintenance and building of the system.

There are different type of clutches for leakage structures that may be used to minimize the risk for leakage in cooling structures, however, these do not necessarily eliminate the risk of leakage. Moreover, conventional solutions may often be expensive, heavy, space inefficient and/or complicated to assemble/disassemble. Thus, there is a need to not only minimize the risk of leakage, but also to control the leakage when it occurs so to reduce the risk of damaging the associated components.

In other words, there is a need in the art for a system for controlling the cooling of an electronic module that is convenient to assemble, dismount, is of low weight, and that reduces the risk of any potential leakage damaging the electronic module. Further, such a system needs to provide an efficient cooling of the electronic module.

SUMMARY

It is therefore an object of the present disclosure to provide a system for controlling the cooling of an electronic module to mitigate, alleviate or eliminate one or more of the above-identified deficiencies and disadvantages.

This object is achieved by means of a system as defined in the appended claims.

In accordance with the invention there is provided a system according to the appended claims.

The present disclosure provides a system according to a first aspect for controlling the cooling of an electronic module, the system comprising an electronic module extending in a first and a second direction, a cooling pipe structure and a leakage device. The cooling pipe structure is arranged to transfer a flow of cooling medium, so to cool the electronic module. Further, the cooling pipe structure comprises a muzzle extending outwardly from a circumferential portion of said cooling pipe structure and a coupling portion being mated with an open end of the muzzle. The leakage device further comprises a leak collecting means circumferentially enclosing a mating interface of the muzzle and the coupling portion, so to collect any leakage from the cooling pipe structure. The leakage device also comprises a transporting portion extending in-between the leak collecting means and an analysis reservoir, so to lead any leakage collected in the leak collecting means to said analysis reservoir.

A benefit of the system disclosed herein is that a mating interface of the muzzle and the coupling portion are circumferentially enclosed allowing for any occurring leakage in the system to be controlled and led away from the electronic module to the analysis reservoir. The system does not necessarily function to fully eliminate leakage, however it functions to fully control where the leakage comes from and where it is led to, while simultaneously protecting the electronic module from any damage from the leakage. The system is also advantageous when being assembled and disassembled, there is a high risk of leakage during the assembly and disassembly of the leakage structure, however, the leak collecting means and the transporting portion may be fixed to the system capturing any leakage during assembly and disassembly of the system. The system will be assembled and disassembled e.g. during serving and maintenance of the system.

The muzzle and the mated coupling portion may extend towards the electronic module, wherein the coupling portion comprises an ending portion being in impermeable contact with the electronic module.

According to some embodiments, the coupling portion may be integral with the electronic module.

A benefit of this is that it allows the cooling medium to be flowing proximate the electronic module, allowing for an efficient cooling whilst not having any risk of leakage. Accordingly, the system is arranged such that any potential leakage occurs from the mating interface.

The system may further comprise a support structure having a first side and an opposing second side, the support structure being arranged intermediate the electronic module and the cooling pipe structure, wherein the electronic module is arranged on the second side of said support structure and the cooling pipe structure is arranged on the first side of the support structure, wherein the coupling portion extends towards the electronic module, at least partly through the support structure.

A benefit of having a support structure is that it allows for stability and robustness of the system.

The mating interface of the muzzle and the coupling portion may be arranged proximate the first side of the support structure. Thus, the mating interface is further separated from the electronic module by the support structure.

The electronic module may be an antenna module comprising a transmitter and/or receiver module, TRM. Further, the electronic module may be an antenna array module, comprising a plurality of antenna elements. The electronic module may comprise 1000-4000 antenna elements. Further the TRM may be divided into a plurality of blocks, each block comprising a plurality of antenna elements arranged in a N×N formation, defining N rows and N columns, N being a positive integer, preferably in the range of 2-8.

The leakage device may be at least partly vertically arranged, wherein any leakage collected in the leak collecting means is transported to the analysis reservoir via the transporting portion by gravitational force.

A benefit of the vertical arrangement of the leakage device is that it can lead any leakage efficiently without any manual effort or any excess equipment.

The cooling pipe structure may further comprise a plurality of pipe units extending in the first direction distributed along the second direction, wherein each pipe unit comprises a leakage device, at least one muzzle and a corresponding coupling portion. Thus, the pipe units may be distributed so to cover an area of the TRM module since it provides coverage in both the first and the second direction. Further, each pipe unit may have a plurality of muzzles allowing each leakage device to be connected to a plurality of muzzles resulting in an efficient leakage collection.

The system may comprise at least one sensor device configured to monitor the presence of medium in the analysis reservoir, wherein the system further comprises control circuitry configured to obtain sensor data from the at least one sensor device indicative of the presence of medium in the analysis reservoir.

A benefit of this is that the system or a user of the system may be notified that any leakage has occurred, allowing for timely maintenance/serving of the system.

The system may further comprises a reservoir module and a pump configured to eject a cooling medium to flow from the reservoir module and circulate through the cooling pipe structure. This allows for a circulating cooling of the system. The pump may ensure an adequate flow of cooling medium through the cooling pipe structure. Furthermore, the cooling medium may be a liquid coolant.

The present disclosure further provides a system according to a second aspect for controlling the cooling of an electronic module, the system comprising an electronic module extending in a first and a second direction, an at least partly vertically extending leakage structure having a first side proximate the electronic module and an opposing second side proximate a cooling pipe structure. The cooling pipe structure is arranged to have a flow of cooling medium, so to cool the electronic module. The cooling pipe structure comprises: a muzzle extending outwardly from a circumferential portion of said cooling pipe structure and a coupling portion being mated with an open end of the muzzle. The muzzle and the coupling portion comprise a mating interface arranged proximate the second side of the leakage structure so to separate any leakage from the electronic module. The leakage structure further comprises a transporting portion extending to an analysis reservoir.

A benefit of the system disclosed herein is that the mating interface arranged proximate the second side of the leakage structure allows for separation of any potential leakage away from the electronic module, so to not damage any electronic components. Further, the system allows for proximate cooling of the electronic module while efficiently protecting the electronic module from potential leakage that may occur. Further, the transporting portion allows for any leakage to be led to the analysis reservoir allowing for any leakage to be analysed and led away from the electronic module. Another, benefit of the system according to the second aspect is that the leakage structure combined with the mating interface allow for: stability to the system in terms of robustness, efficiently separating leakage from the electronics and efficiently leading leakage to a predetermined reservoir while being compact and cheap to manufacture and assemble.

The muzzle and the mated coupling portion may extend towards the electronic module. Thus, the muzzle and the mated coupling portion may be close to the electronic module while protecting the electronic module from any leakage damage.

According to some embodiments, the coupling portion may be integral with the electronic module.

Further, the coupling portion may extend towards the electronic module, at least partly through the leakage structure, wherein an ending portion of the coupling portion is in impermeable contact with the electronic module.

A benefit of this is that it allows the cooling medium to be flowing proximate the electronic module, allowing for an efficient cooling whilst not having any risk of leakage. Accordingly, the system is arranged such that any potential leakage occurs from the mating interface and leaks down the transporting portion.

The transporting portion may be an open channel formed on the second side of the leakage structure associated with the mating interface of the muzzle and the coupling portion. Thus, it allows for a convenient forming of the transporting portion since it may be an open channel formed on the second side of the leakage structure. This still allows potential leakage to be separated from the electronic module since the electronic module is positioned proximate the first side of the leakage structure.

The leakage structure may be a corrugated sheet comprising distributed depressions facing the electronic module. According to some embodiments, the leakage structure may be a double corrugated sheet.

The system may further comprising a support structure, wherein the cooling pipe structure is arranged intermediate the support structure and the leakage structure. The support structure helps to allow for increased robustness of the system.

The electronic module may be an antenna module comprising a transmitter and/or receiver module, TRM. Accordingly, the antenna module may comprise a plurality of antenna elements.

Moreover, leakage may be transported to the analysis reservoir via the transporting portion by gravitational force. A benefit of this is that the system can lead any leakage efficiently without any manual effort or any excess equipment.

The cooling pipe structure may further comprise a plurality of pipe units extending in the first direction distributed along the second direction, each pipe unit comprising at least one muzzle and a corresponding coupling portion.

Accordingly, the pipe units may be distributed so to cover an area of the TRM module since it provides coverage in both the first and the second direction. Further, each pipe unit may have a plurality of muzzles allowing each leakage device to be connected to a plurality of muzzles resulting in an efficient leakage collection. Further, the plurality of muzzles allow for the cooling pipe structure to be in contact with the TRM module in a plurality of areas.

The system may comprise at least one sensor device configured to monitor the presence of medium in the analysis reservoir, wherein the system further comprises control circuitry configured to obtain sensor data from the at least one sensor device indicative of the presence of medium in the analysis reservoir.

A benefit of this is that the system or a user of the system may be notified that any leakage has occurred, allowing for timely maintenance/serving of the system.

The system may further comprise a reservoir module and a pump configured to eject a cooling medium to flow from the reservoir module and circulate through the cooling pipe structure.

This allows for a circulating cooling of the system. The pump may ensure an adequate flow of cooling medium through the cooling pipe structure. Furthermore, the cooling medium may be a liquid coolant.

The cooling medium may be a liquid coolant.

BRIEF DESCRIPTION OF THE DRAWINGS

In the following the disclosure will be described in a non-limiting way and in more detail with reference to exemplary embodiments illustrated in the enclosed drawings, in which.

DETAILED DESCRIPTION

Figure 1:
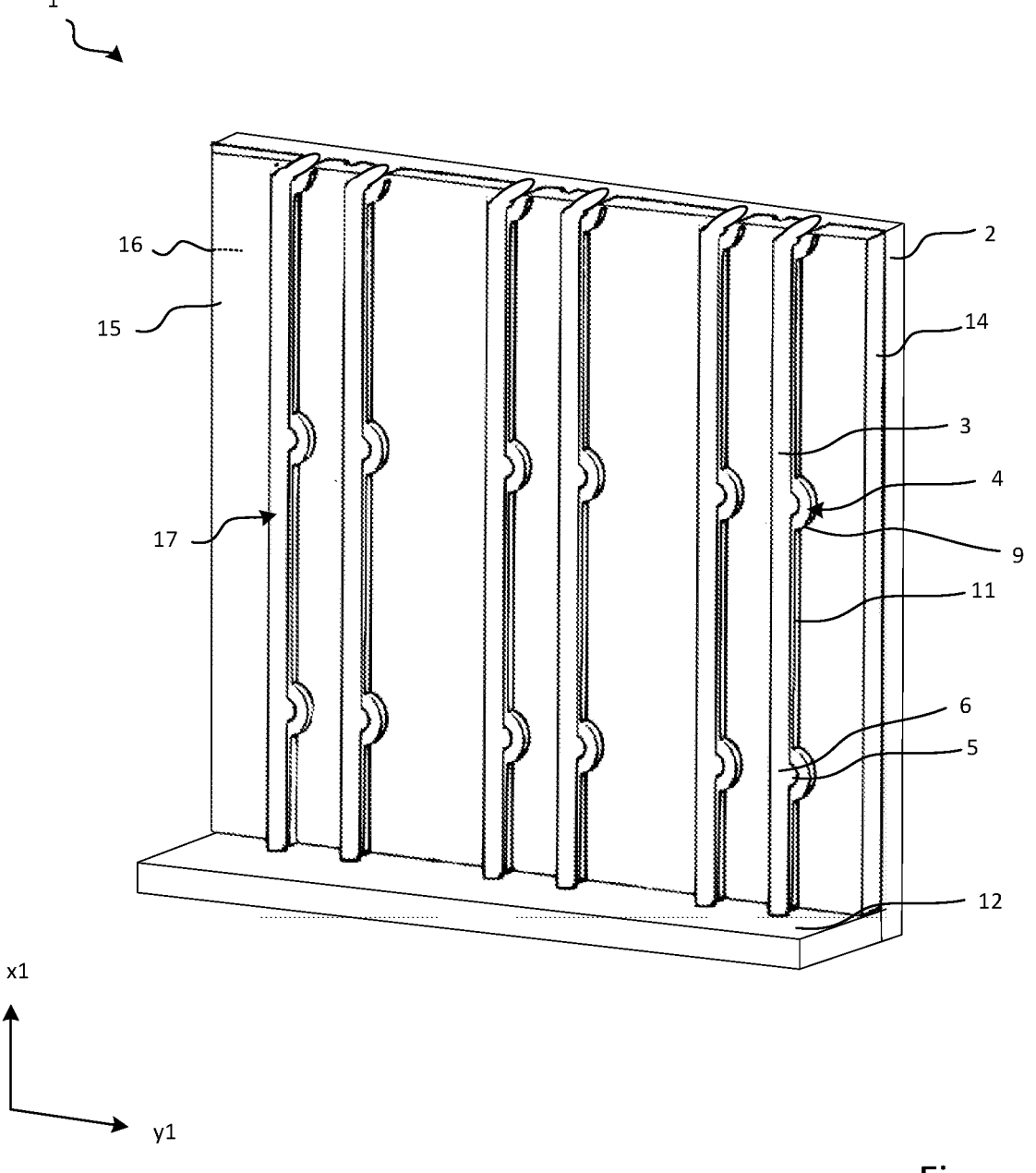
FIG. 1 illustrates an objective view of a system for controlling the cooling of an electronic module according to a first aspect of the disclosure

In the following detailed description, some embodiments of the present disclosure will be described. However, it is to be understood that features of the different embodiments are exchangeable between the embodiments and may be combined in different ways, unless anything else is specifically indicated. Even though in the following description, numerous specific details are set forth to provide a more thorough understanding of the provided system, it will be apparent to one skilled in the art that the system may be realized without these details. In other instances, well known constructions or functions are not described in detail, so as not to obscure the present disclosure.

In the following description of example embodiments, the same reference numerals denote the same or similar components.

The term "mating interface" as disclosed herein refers to the association in-between two parts (e.g. a muzzle and a coupling portion).

FIG. 1 illustrates an objective view of a system 1 for controlling the cooling of an electronic module 2 according to a first aspect. The system 1 comprises an electronic module 2 extending in a first x1 and a second direction y1, a cooling pipe structure 3 and a leakage device 4. The cooling pipe structure 3 is arranged to transfer a flow of cooling medium, so to cool the electronic module 2.

Figure 2:
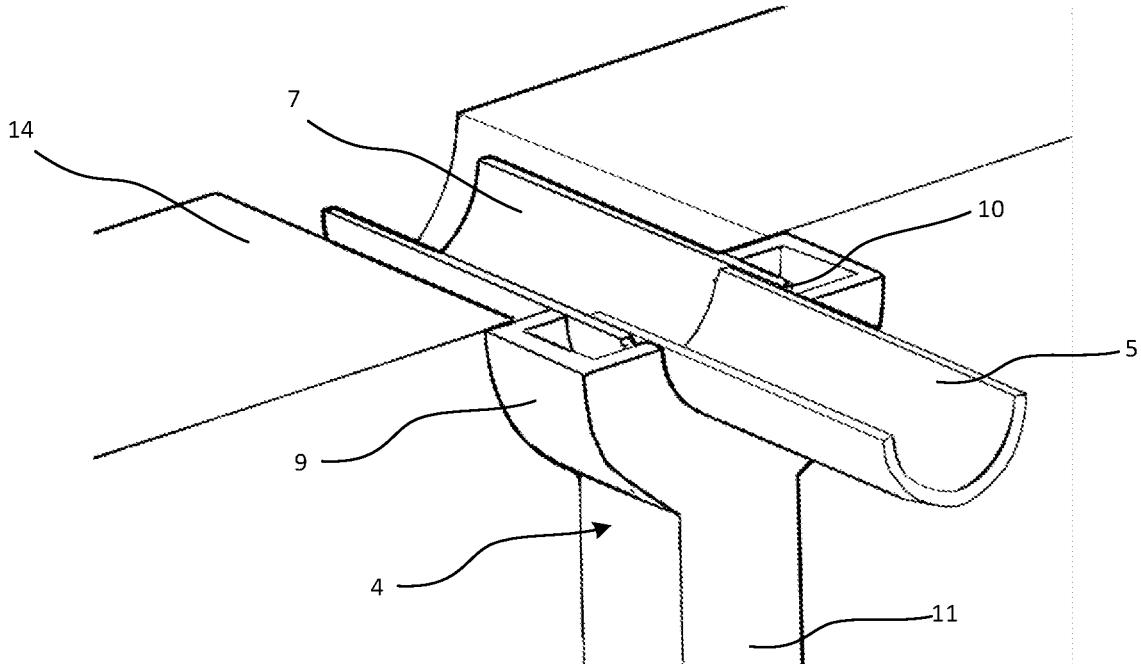
FIG. 2 illustrates a cut-out objective view of a part of the system showing a cross-section of the muzzle, coupling portion and the leak collecting means
Figure 4:
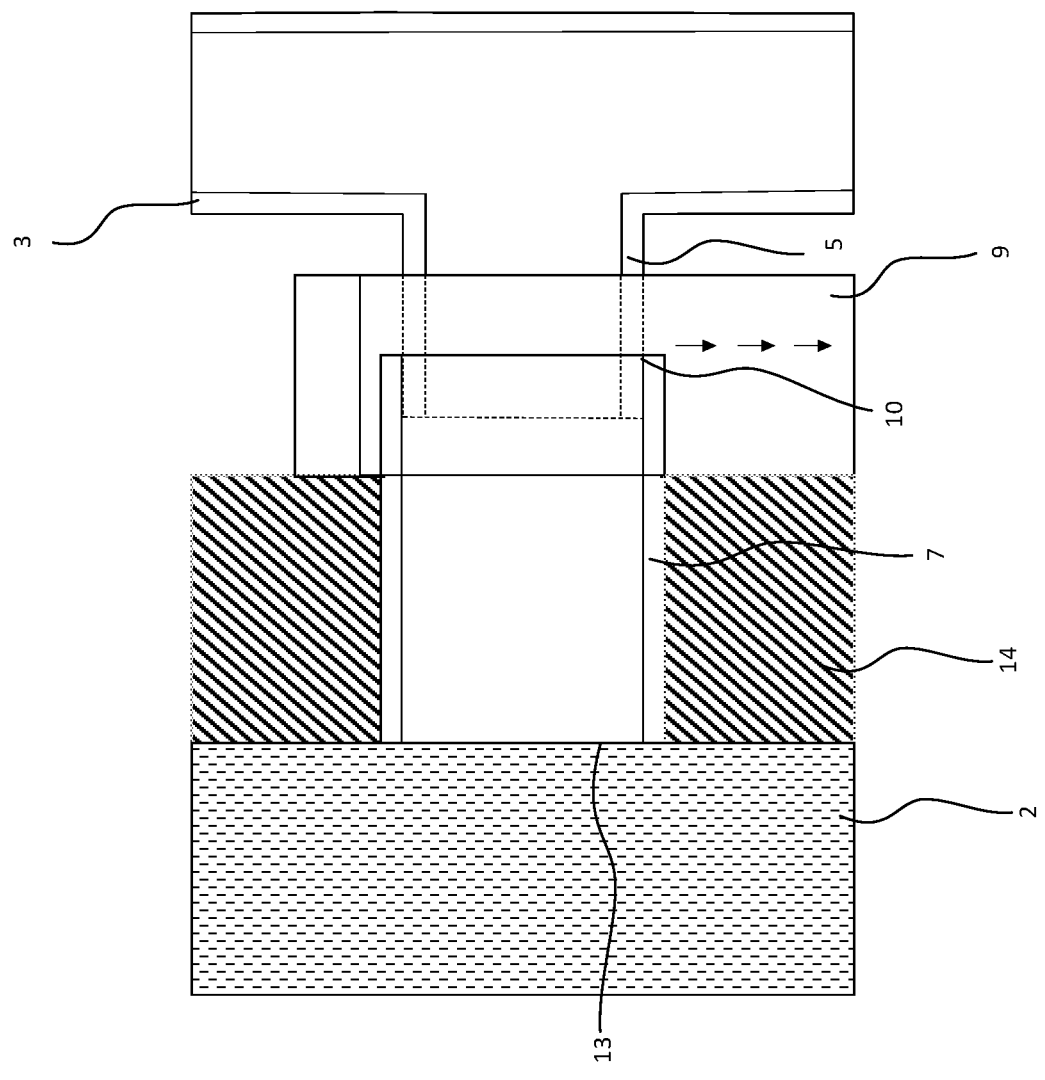
FIG. 4 illustrates a cut-out cross-section of a side view of the system

The cooling pipe structure 3 further comprises a muzzle 5 extending outwardly from a circumferential portion 6 of said cooling pipe structure 3 and a coupling portion 7 being mated with an open end of the muzzle 5 (not shown, see FIGS. 2 and 4). Moreover, the leakage device 4 comprises a leak collecting means 9 circumferentially enclosing a mating interface 10 of the muzzle 5 and the coupling portion 7 (see FIGS. 2 and 4), so to collect any leakage from the cooling pipe structure 3. Further, the leakage device 4 comprises a transporting portion 11 extending in-between the leak collecting means 9 and an analysis reservoir 12, so to lead any leakage collected in the leak collecting means 9 to said analysis reservoir 12.

The system 1 provide the benefit of being able to be mounted and dismounted conveniently, further being cheap to manufacture and it may collect any potential leakage. The system 1 is arranged such that any potential leakage from the system will be leaked from the mating interface 10 of the system 1.

FIG. 1 further illustrates that the system 1 may further comprise a support structure 14 having a first side 15 and an opposing second side 16, the support structure 14 being arranged intermediate the electronic module 2 and the cooling pipe structure 3, wherein the electronic module 2 is arranged on the second side 16 of said support structure 14 and the cooling pipe structure 3 is arranged on the first side 15 of the support structure 14, wherein the coupling portion 7 extends towards the electronic module 2, at least partly through the support structure 14. The support structure 14 may allow for an improved robustness of the system 1. The cooling pipe structure 3 and/or the leakage device 4 and/or the electronic module 2 may all be mounted to the support structure 14. The system 1 may be embedded/enclosed by a radome (as seen in the second aspect of the system in FIG. 14).

Moreover, there is shown in FIG. 1, the cooling pipe structure 3 may comprise a plurality of pipe units 17 extending in the first direction x1 distributed along the second direction y1, wherein each pipe unit 17 comprises a leakage device 4, at least one muzzle 5 and a corresponding coupling portion 7. Accordingly, the cooling pipe structure 3 may be arranged to cover the area of the electronic module 2.

As shown in FIG. 1, the leakage device 4 may be at least partly vertically arranged, wherein any leakage collected in the leak collecting means 9 is transported to the analysis reservoir 12 via the transporting portion 11 by gravitational force.

FIG. 2 shows a cut-out objective view of a part of the system 1 where a cross-section of the muzzle 5, coupling portion 7 and the leak collecting means 9 is shown. FIG. 2 shows that the mating interface 10 of the muzzle and the coupling portion is arranged to be enclosed by the leak collecting means 9. Accordingly, the leak collecting means 9 may circumferentially enclose the mating interface 10 as shown in FIGS. 1 and 2. However, according to some embodiments, the leak collecting means 9 only encloses a part of the mating interface 10 that may be associated with leakage. As seen in FIG. 2, any potential leakage from the mating interface 10 will be led in to the leak collecting means 9.

During dismounting and/or mounting and/or maintenance of the system 1, the muzzle 5 and the coupling portion 7 might have to be disengaged from each other, which may result in leakage of residual medium (e.g. residual cooling liquid) in the system 1. However, due to the arrangement of the pipe structure 3 in relation to the leak collecting means 9, any potential leakage that is associated with the mounting or dismounting of the pipe structure 3 will also be collected. Thus, the cooling pipe structure 3 will allow to control leakage, not only during the functioning of the system 1, but also during service, mounting, and dismounting the system. Accordingly, this allow for the system 1 to have an efficient/improved maintenance which results in a more reliable system.

FIG. 2 illustrates that the mating interface 10 of the muzzle 5 and the coupling portion 7 is arranged proximate the first side 15 of the support structure 14. In other words, the mating interface 10 of the muzzle 5 and the coupling portions 7 are associated with the first side 15 of the support structure 14. Thus, the electronic module 2 and the mating interface 10 are on opposing sides of the support structure 14.

Figure 3:
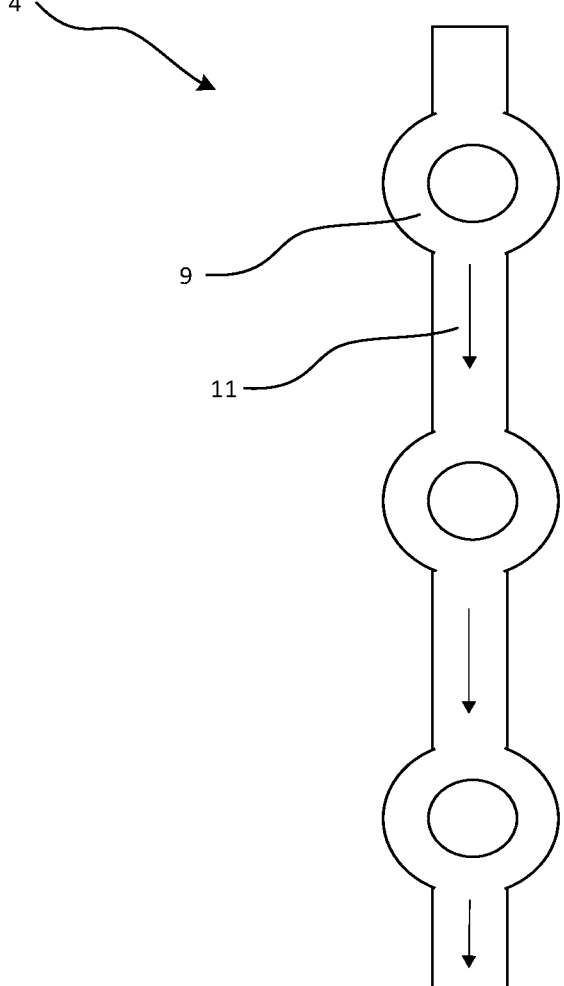
FIG. 3 illustrates the leakage device of the system in FIG. 1 from a front view with arrows indicating the direction of any leakage

FIG. 3 shows the leakage device 4 from a front view with arrows indicating the direction of any leakage. As seen in FIG. 3, the leakage device 4 may have leak collecting means 9 that is arranged to circumferentially enclose a mating interface 10 (as seen in FIG. 2). Further, there may be a plurality of interconnected leak collecting means 9 (also shown in FIG. 1) and transporting portions 11 such that at least a first and a second leak collecting means 9 are connected by a transporting portion 11. In FIG. 3, there is shown three leak collecting means 9 being connected. This allows for leakage to be transported by a common part. Further, the leakage device 4 may preferably be vertically arranged.

FIG. 4 shows a cut-out cross-section of a side view of the system 1. As seen in FIG. 4, the muzzle 5 and the mated coupling portion 7 extend towards the electronic module 2, wherein the coupling portion 7 comprises an ending portion 13 being in impermeable contact with the electronic module 2. The coupling portion 7 may be in contact with a cooling plate on the electronic module 2 or any other suitable interface on the electronic module 2 that is arranged to receive the ending portion 13 of the coupling portion 7. This allows for that any potential leakage occurs from the mating interface 10 which will be collected by the leakage device 4. Further, by having the coupling portion 7 in impermeable contact with the electronic module 2 it allows for efficient cooling of the electronic module 2. As shown in FIG. 4, the muzzle 5 is mated with the coupling portion 7 by a male/female connecting means, wherein the muzzle 5 is a male connector inserted in a female connector being the coupling portion 7. However, according to some embodiments, the muzzle 5 is the female connector and the coupling portion 7 is a male connector.

It's indicated by the arrows in FIG. 4 that any leakage will potentially occur from the mating interface 10 and be collected by the leakage device 4. Further, FIG. 4 illustrates that the coupling portion 7 penetrates the support structure 14. Thus, the support structure 14 may act as an additional barrier separating leakage from the electronic module 2.

Figure 5:
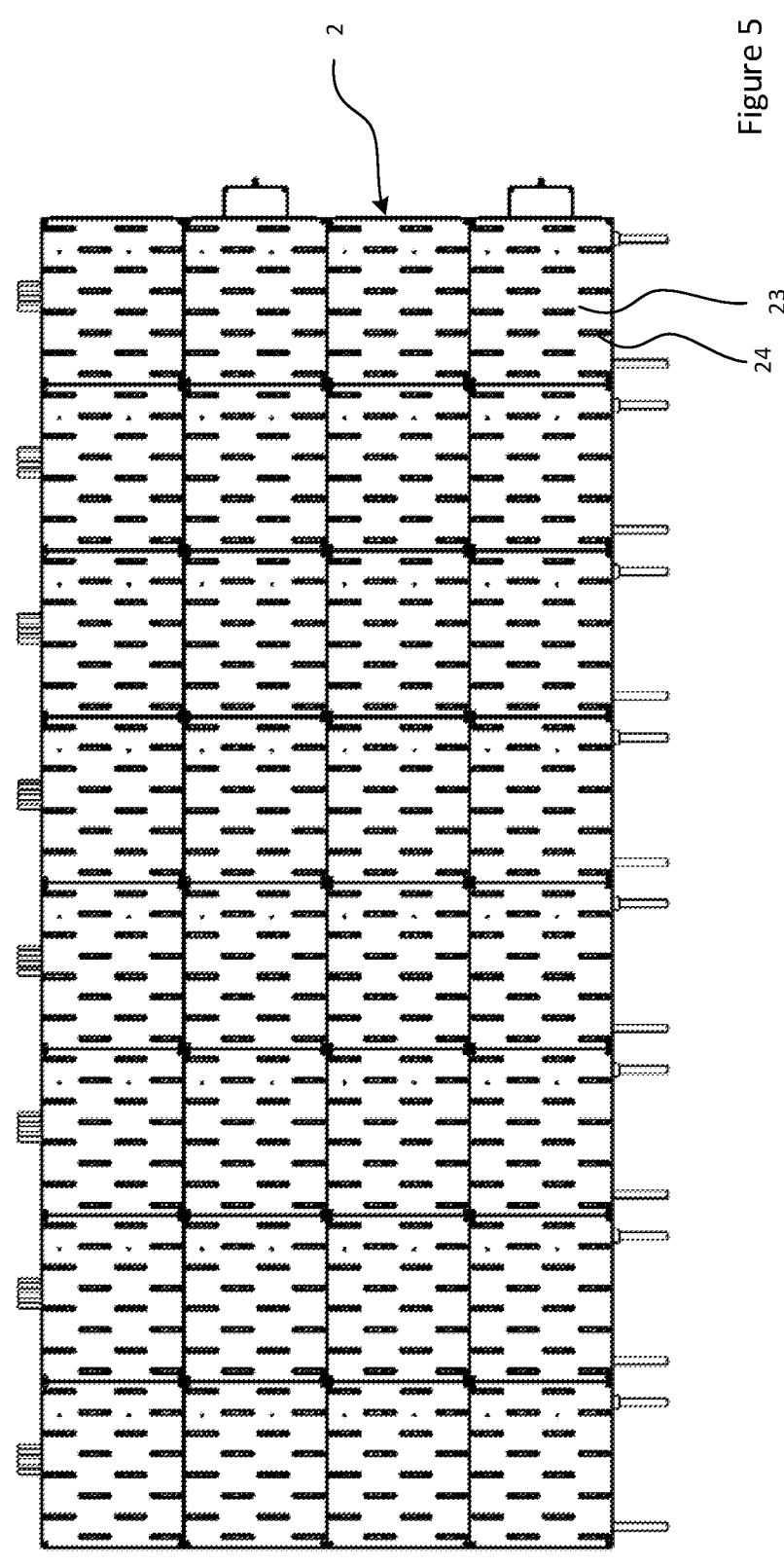
FIG. 5 illustrates a back view of the system

FIG. 5 shows the electronic module 2 from a front view, where the electronic module 2 is an antenna module comprising a transmitter and/or receiver module, TRM. The opposite side of the electronic module 2 in FIG. 5 may be connected to the support structure 14. As shown in FIG. 5, the electronic module 2 comprises a plurality of TRM units. In FIG. 5 there are 4×8 TRM units 23. Each TRM u nit 23 may comprise a plurality of antenna elements 24. In FIG. 5, there is shown that each TRM unit 23 comprises 4×4 antenna elements 24. The antenna elements 24 may be any suitable antenna element 24 such as slot, body-of-revolution, Vivaldi antenna elements or any other suitable antenna element 24.

Figure 6:
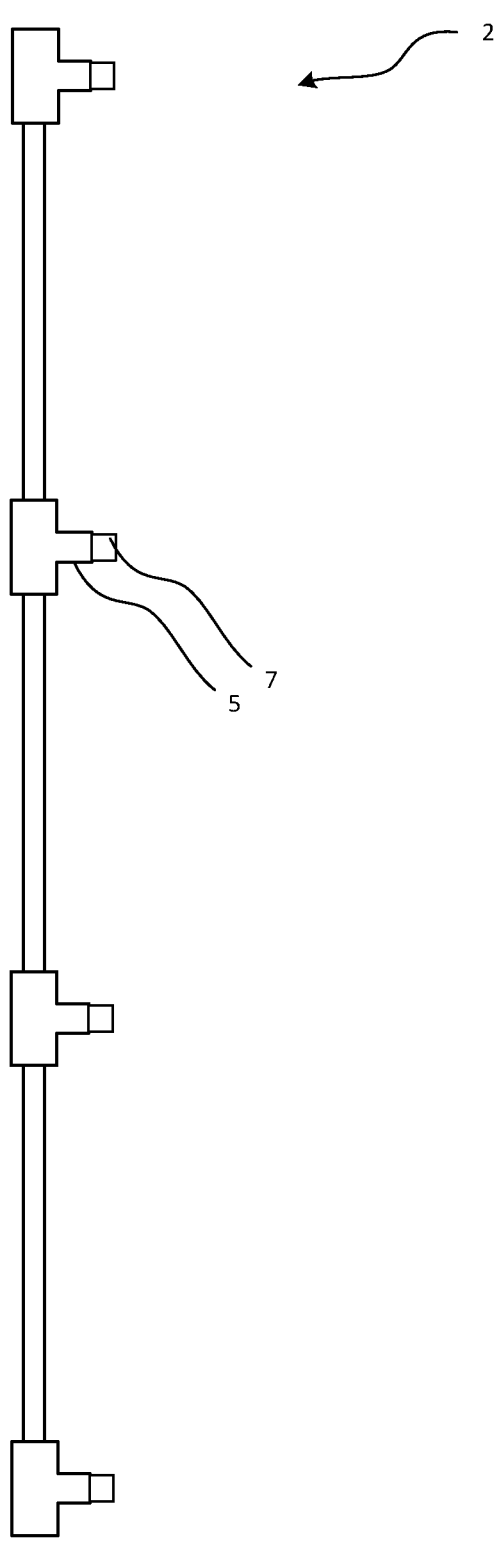
FIG. 6 illustrates a side view of a cooling pipe structure

FIG. 6 shows a part of a cooling pipe structure 3 from a side view. As seen in FIG. 6, the muzzle 5 may be a separate part that is mounted to the pipe structure 3. This allows for a convenient assembly of the cooling pipe structure 3.

Figure 7:
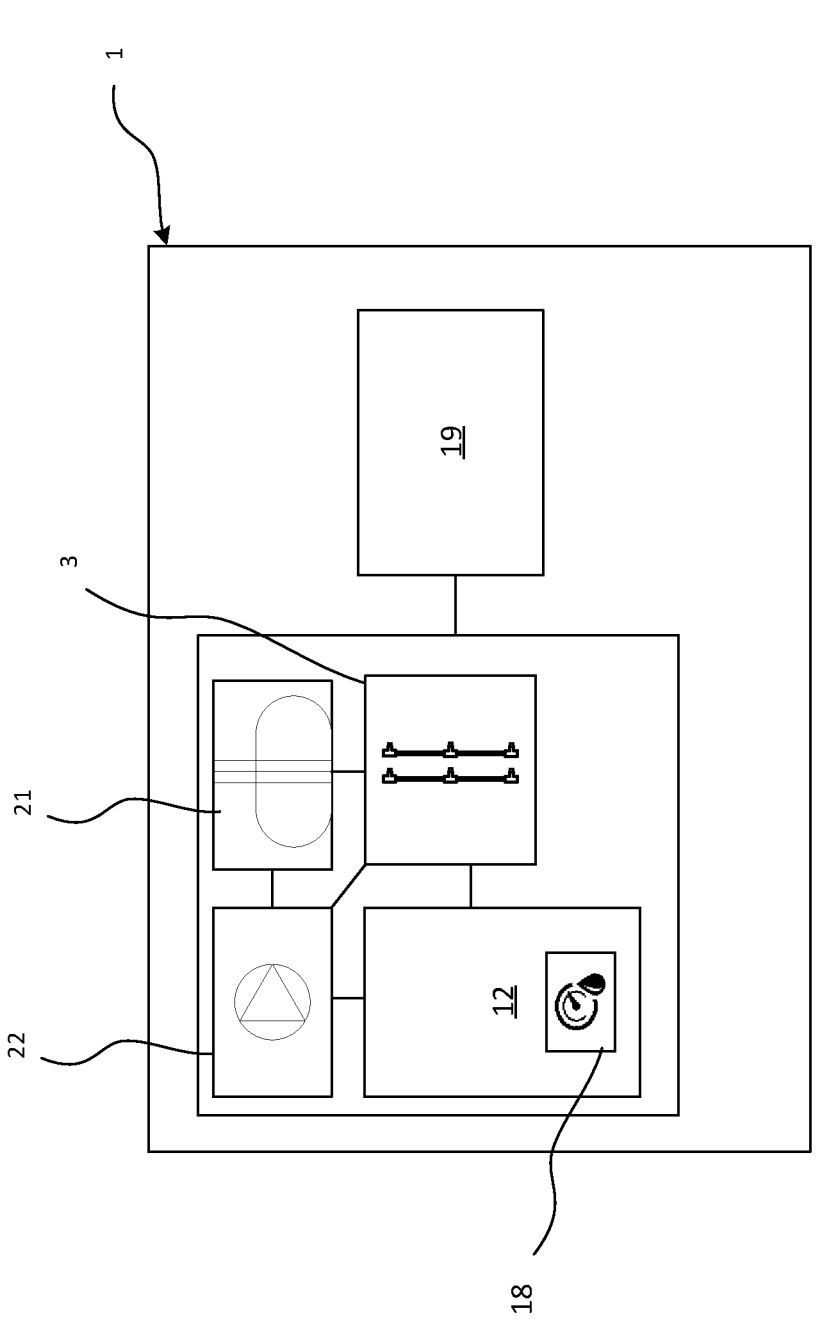
FIG. 7 illustrates a schematic view of the system

FIG. 7 shows a schematic view of the system 1. As seen in FIG. 7 the system may comprise at least one sensor device 18 configured to monitor the presence of medium in the analysis reservoir 12, wherein the system 1 further comprises control circuitry 19 configured to obtain sensor data from the at least one sensor device 18 indicative of the presence of medium in the analysis reservoir 12.

As further seen in FIG. 7, the system may comprise a reservoir module 21 and a pump 22 configured to eject a cooling medium to flow from the reservoir module 21 and circulate through the cooling pipe structure 3. The sensor data obtained from the sensor device 18 allow for a user to timely be aware of any leakage in the system 1. The cooling medium may be a liquid coolant.

Figure 8:
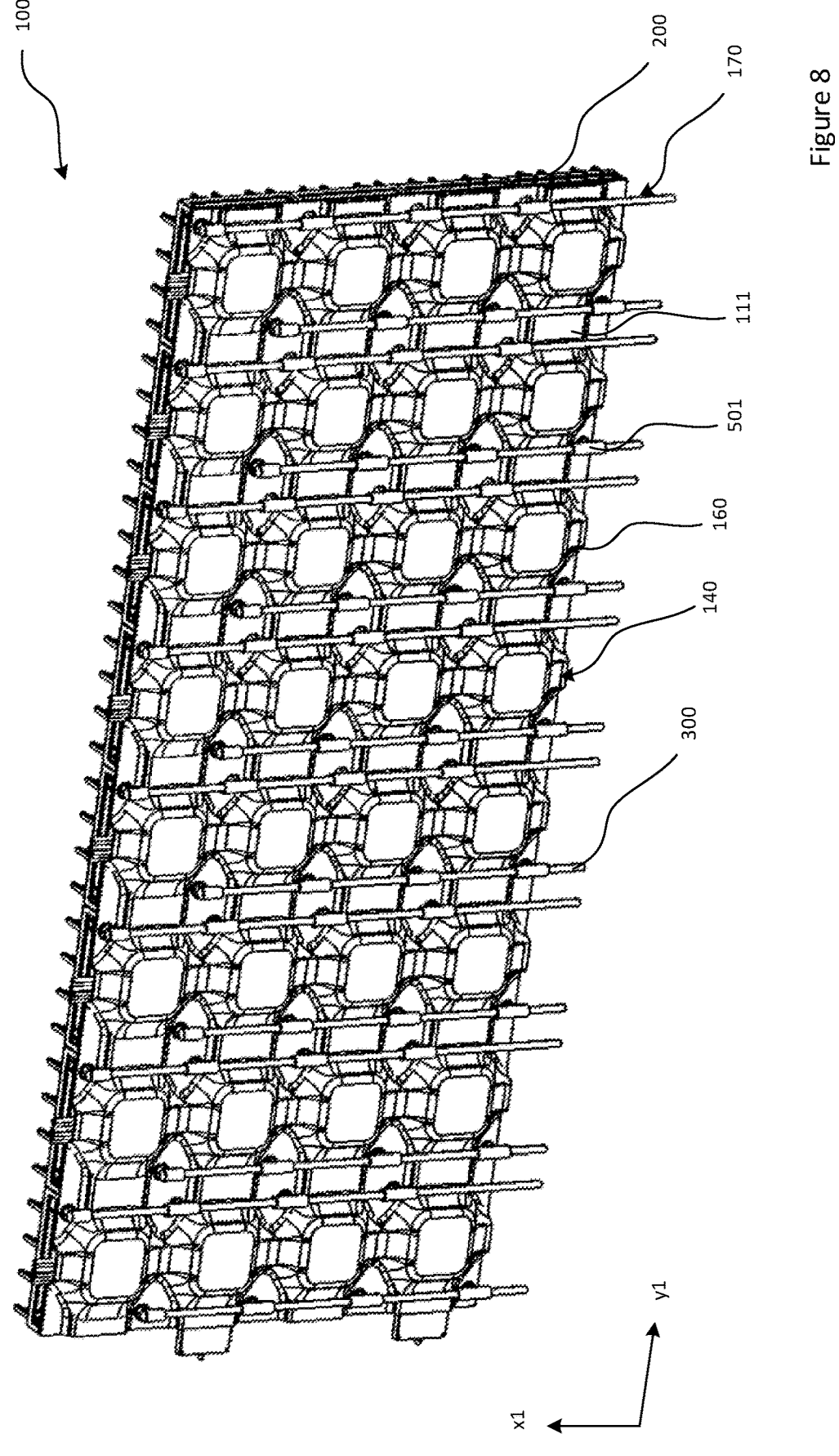
FIG. 8 illustrates an objective view of a system for controlling the cooling of an electronic module according to a second aspect of the disclosure

FIG. 8 shows an objective view of the system 100 according to a second aspect. FIG. 8 shows a system 100 for controlling the cooling of an electronic module 200, the system 100 comprises an electronic module 200 extending in a first and a second direction x1, y1. Further, the system 100 comprises an at least partly vertically extending leakage structure 140 having a first side 150 (not shown, see FIG. 9) proximate (or associated to) the electronic module 200 and an opposing second side 160 proximate (or associated to) a cooling pipe structure 300. The cooling pipe structure 300 is arranged to have a flow of cooling medium, so to cool the electronic module 200. The cooling pipe structure 200 further comprises a muzzle 500 (not shown, see FIG. 9) extending outwardly from a circumferential portion 501 of said cooling pipe structure 300 and a coupling portion 700 being mated with an open end 810 of the muzzle 500 (see FIG. 9), wherein the muzzle 500 and the coupling portion 700 comprise a mating interface 110 arranged proximate the second side 160 of the leakage structure 140 so to separate any leakage from the electronic module 200. The leakage structure 140 further comprises a transporting portion 111 extending to an analysis reservoir (not shown, see FIG. 13).

The system 100 provide the benefit of being able to be mounted and dismounted conveniently, further being cheap to manufacture and it may collect any potential leakage. The system 100 is arranged such that any potential leakage from the system 100 will be leaked from the mating interface 110 of the system. The leakage structure 140 provides for stability for the system 100 and also provides for a separation between the electronic module 200 and any potential leakage since the mating interface 110 is arranged proximate the second side 160 of the leakage structure while the electronic module 200 is arranged on the opposing side.

In FIG. 8 there is further shown that the cooling pipe structure 300 may comprise a plurality of pipe units 170 extending in the first direction x1 distributed along the second direction y1. Each pipe unit 170 may comprise at least one muzzle 500 and a corresponding coupling portion 700.

Figure 9:
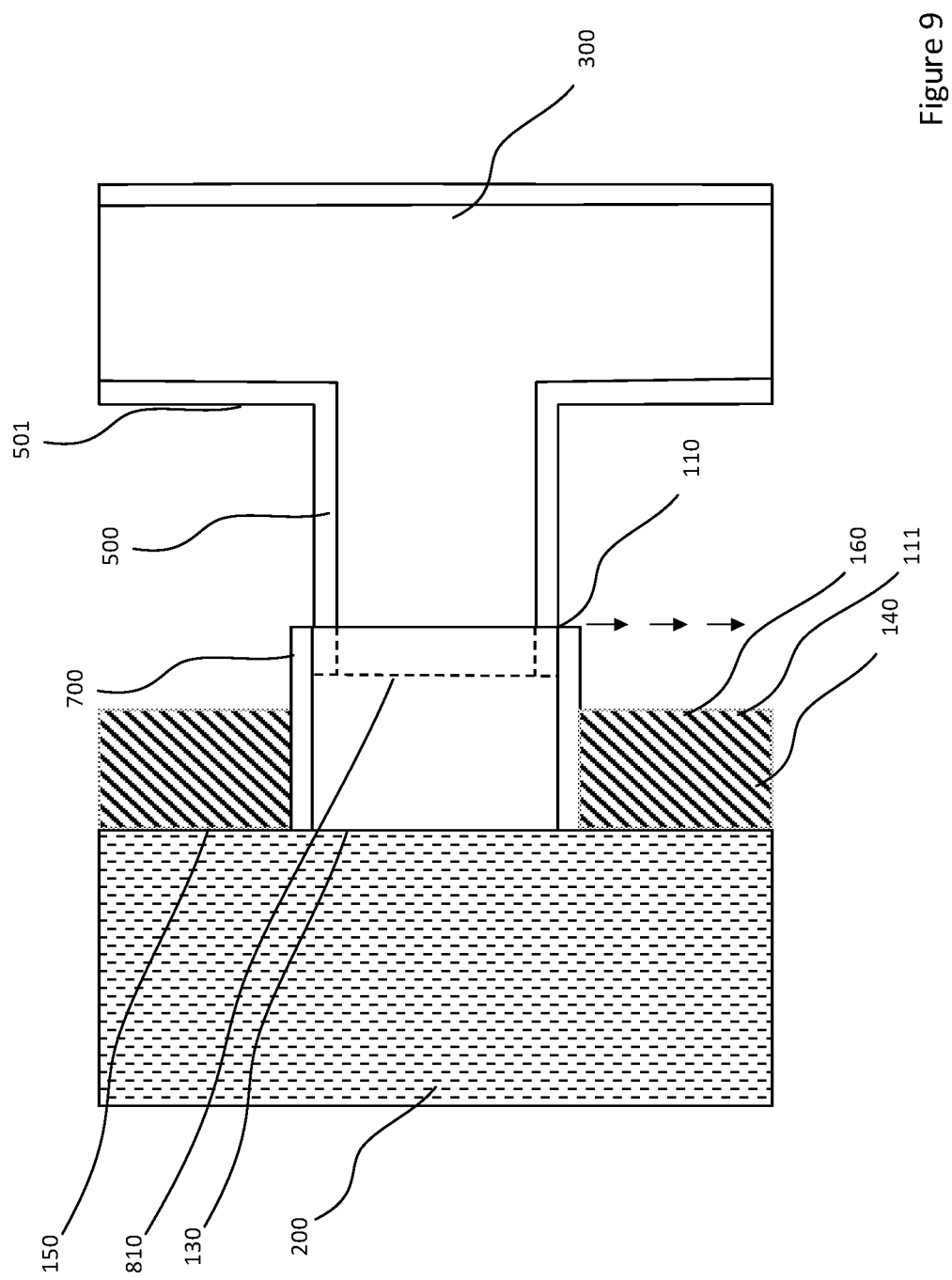
FIG. 9 illustrates a cut-out cross-section of a side view of the system

FIG. 9 shows a cut-out cross-section of a side view of the system 100. As seen in FIG. 9, the muzzle 500 and the mated coupling portion 700 extend towards the electronic module 200 and the coupling portion 700 may extend towards the electronic module 200, at least partly through the leakage structure 140, wherein an ending portion 130 of the coupling portion 700 is in impermeable contact with the electronic module 200 which is seen in FIG. 9.

It's indicated by the arrows in FIG. 9 that any leakage will potentially occur from the mating interface and be separated from the electronic module 200 by the leakage structure 400. Further, FIG. 9 illustrates that the coupling portion 700 penetrates the leakage structure 140.

As shown in FIG. 9, the muzzle 500 is mated with the coupling portion 700 by a male/female connecting means, wherein the muzzle 500 is a male connector inserted in a female connector being the coupling portion 700. However, according to some embodiments, the muzzle 500 is the female connector and the coupling portion 700 is the male connector.

The coupling portion 700 may be in contact with a cooling plate on the electronic module 200 or any other suitable interface on the electronic module 200 that is arranged to receive the ending portion 130 of the coupling portion 700. This allows for that any potential leakage occurs from the mating interface 110 which will be collected by the leakage structure 140. Further, by having the coupling portion 700 in impermeable contact with the electronic module 200 it allows for efficient cooling of the electronic module 200.

Figure 10:
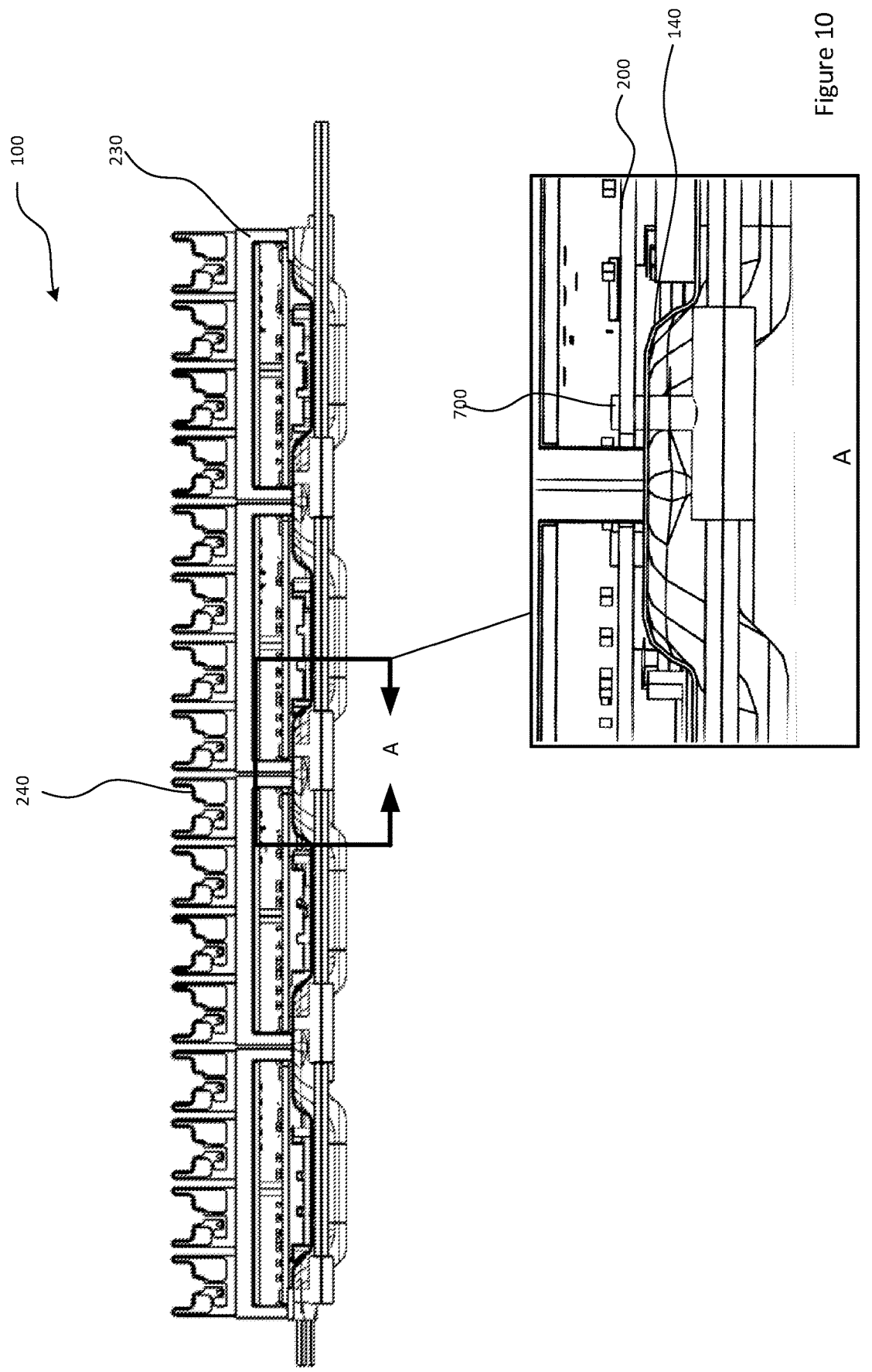
FIG. 10 illustrates a side view of the system according to a second aspect of the disclosure and a detailed section A of the system

FIG. 10 shows a side view of the system 100 and a detailed view of an area A of the side view. The detailed view A of FIG. 10 shows how the coupling portion 700 is attached to the electronic module 200 and that the coupling portion 700 penetrates the leakage structure 140 (also seen in FIG. 9).

As illustrated in FIG. 10, the electronic module 200 may be an antenna module comprising a transmitter and/or receiver module, TRM. The antenna module may have a plurality of antenna elements 240 as shown in FIG. 10. The antenna elements 240 may be any suitable antenna element 240 such as slot, body-of-revolution, Vivaldi antenna elements or any other suitable antenna element.

As shown in FIG. 10, the electronic module 200 comprises a plurality of TRM units 230. In FIG. 10 there are seen 4 TRM units 230. Each TRM unit 230 may comprise a plurality of antenna elements 240. In FIG. 10, there is shown that each TRM unit 230 comprises at least 4 antenna elements 240. Each TRM unit may comprise 16 antenna elements 240 arranged in a 4×4 formation.

Figure 11:
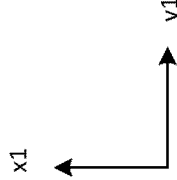
FIG. 11 illustrates a front view of the system

FIG. 11 shows a front view of the system 100, where the leakage structure 140 and the cooling pipe structure 300 are shown from the front.

As further shown in FIG. 11 said transporting portion 111 may be an open channel formed on the second side 160 of the leakage structure 140 associated with the mating interface 110 of the muzzle 500 and the coupling portion 700 (shown in FIG. 9). The transporting portion 111 may lead to an analysis reservoir 120 (not shown, see FIG. 13).

FIG. 11 further illustrates that the leakage structure 140 is a corrugated sheet comprising distributed depressions facing the electronic module (electronic module is not seen in FIG. 11). The corrugated sheet may be a double corrugated sheet. The corrugated sheet allow for the first side 150 of the leakage structure 140 facing the electronic module 200 to allow for the electronic module 200 to arrange electronic components in a space efficient manner.

The system 100 may be at least partly vertically arranged as shown in FIG. 11, adapted to transport any leakage to the analysis reservoir 120 via the transporting portion 111 by gravitational force.

Figure 12:
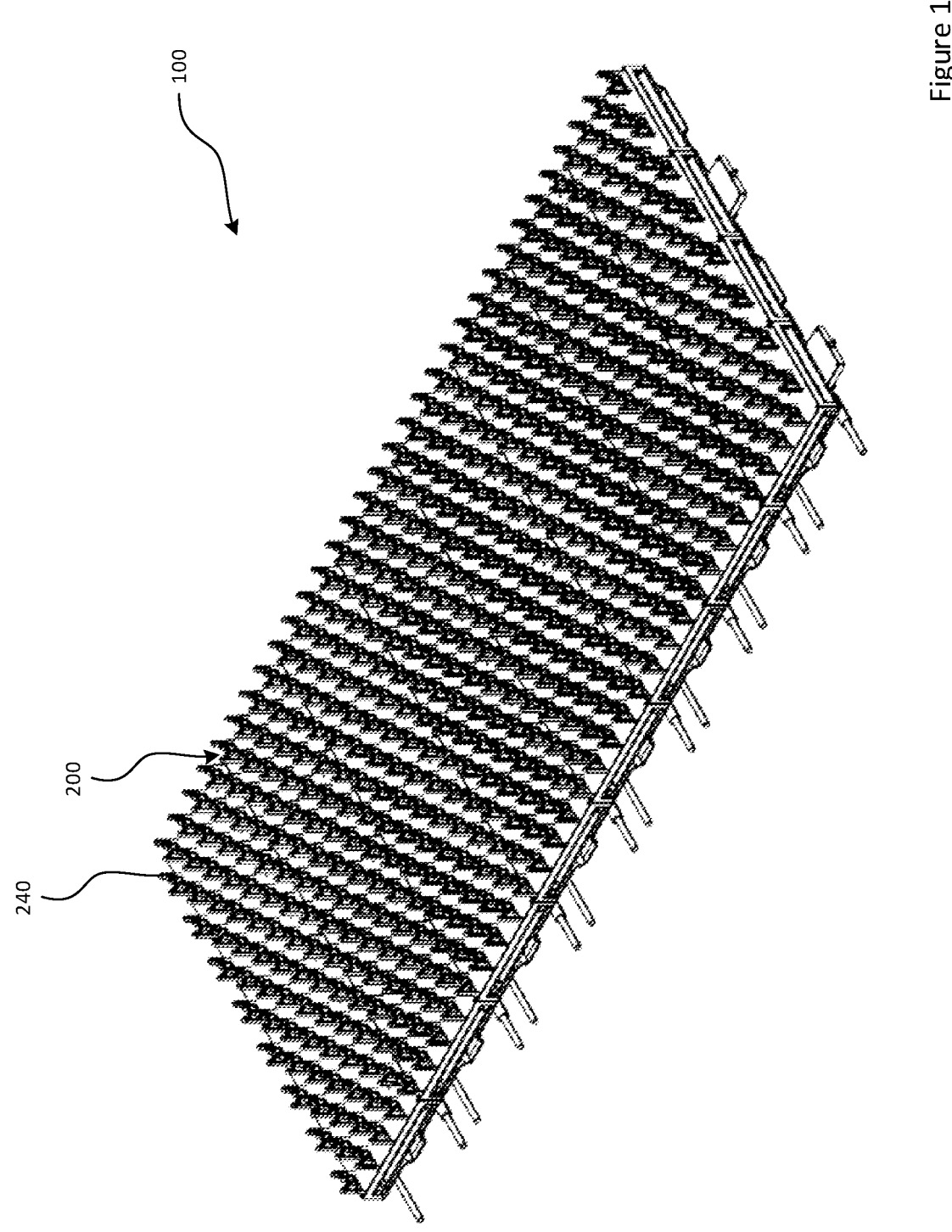
FIG. 12 illustrates a back view of the system

FIG. 12 shows an objective view of the system 100 from a back side where the electronic module i.e. TRM is seen and it is seen that the TRM comprises antenna elements 240 being distributed along the area of the TRM.

Figure 13:
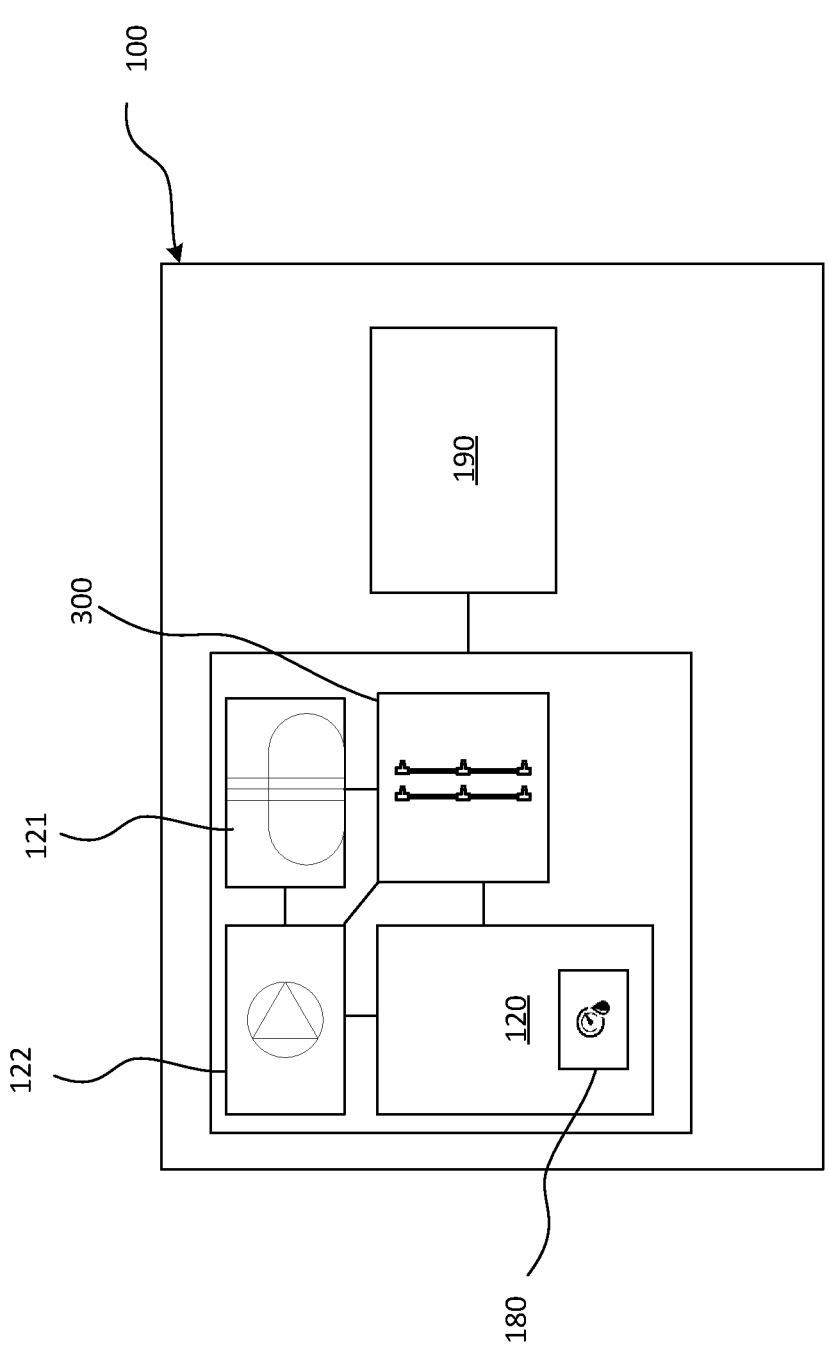
FIG. 13 illustrates a schematic view of the system.

FIG. 13 shows a schematic view of the system 100. As seen in FIG. 13 the system 100 may comprise at least one sensor device 180 configured to monitor the presence of medium in the analysis reservoir 120, wherein the system 100 further comprises control circuitry 190 configured to obtain sensor data from the at least one sensor device 180 indicative of the presence of medium in the analysis reservoir 120.

As further seen in FIG. 13, the system 100 may comprise a reservoir module 121 and a pump 122 configured to eject a cooling medium to flow from the reservoir module 121 and circulate through the cooling pipe structure 300. The sensor data obtained from the control circuitry 190 allow for a user to timely be aware of any leakage in the system 100. The cooling medium may be a liquid coolant.

Figure 14:
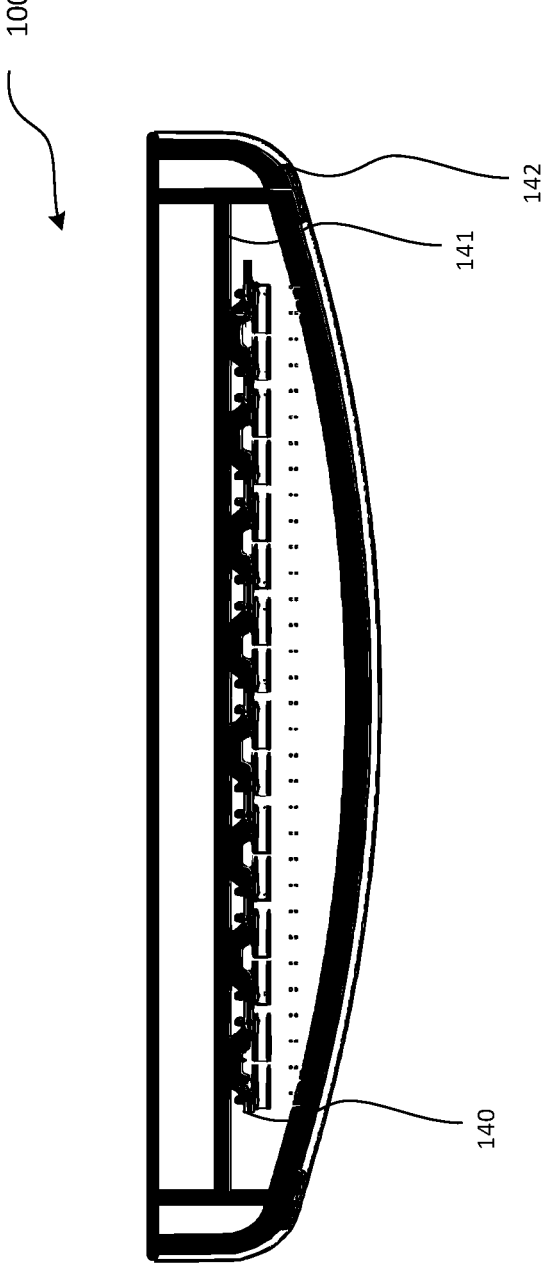
FIG. 14 illustrates a cross sectional top view of the system, where the system further comprises a support structure.

FIG. 14 shows a cross sectional top view of the system 100. In FIG. 14, the system further comprises a support structure 141. The cooling pipe structure may be at least partly arranged intermediate the support structure 141 and the leakage structure 140. In FIG. 14 the support structure 141 bears the system 100. However, the support structure 141 in FIG. 14 is enclosed in a radome 142.

A base station may comprise the system 100, 1 according to any aspect of the present disclosure.

Further, according to any of the aspects or embodiments in the present disclosure:

The cooling pipe structure 3, 300 may be a plastic pipe structure allowing for a cheap structure with a low weight.

Further, the cooling pipe structure 3, 300 may have an inner diameter of 7-15 mm.

The leakage structure 140 may be an aluminium leakage structure, or any suitable composite.

It should be noted that features from the first aspect of the present disclosure may be combined with features from the second aspect.

The invention claimed is:

1. A system for controlling the cooling of an electronic module, the system comprising;

an electronic module extending in a first (x1) and a second direction (y1), an at least partly vertically extending leakage structure having a first side-proximate the electronic module and an opposing second side proximate a cooling pipe structure;

wherein the cooling pipe structure is arranged to have a flow of cooling medium, so to cool the electronic module;

wherein the cooling pipe structure comprises:

a muzzle extending outwardly from a circumferential portion of said cooling pipe structure; and a coupling portion being mated with an open end of the muzzle;

wherein the muzzle and the coupling portion comprise a mating interface arranged proximate the second side of the leakage structure so to separate any leakage from the electronic module, wherein said leakage structure further comprises a transporting portion extending to an analysis reservoir, wherein the coupling portion extends towards the electronic module, at least partly through the leakage structure, wherein an ending portion of the coupling portion is in contact with the electronic module, wherein the system further comprises a reservoir module and a pump configured to eject a cooling medium to flow from the reservoir module and circulate through the cooling pipe structure.

2. The system according to claim 1, wherein the muzzle and the mated coupling portion extend towards the electronic module.

3. The system according to claim 1, wherein said transporting portion is an open channel formed on the second side of the leakage structure associated with the mating interface of the muzzle and the coupling portion.

4. The system according to claim 1, wherein the leakage structure is a corrugated sheet comprising distributed depressions facing the electronic module.

5. The system according to claim 1, further comprising a support structure, wherein the cooling pipe structure is arranged intermediate the support structure and the leakage structure.

6. The system according to claim 1, wherein the electronic module is an antenna module comprising a transmitter and/or receiver module (TRM).

7. The system according to claim 1, wherein any leakage is transported to the analysis reservoir via the transporting portion by gravitational force.

8. The system according to claim 1, wherein the cooling pipe structure comprises:

a plurality of pipe units extending in the first direction ($x1$) distributed along the second direction ($y1$), each pipe unit comprising at least one muzzle and a corresponding coupling portion.

9. The system according to claim 1, wherein the system comprises at least one sensor device configured to;

monitor the presence of medium in the analysis reservoir, wherein the system further comprises control circuitry configured to;

obtain sensor data from the at least one sensor device indicative of the presence of medium in the analysis reservoir.

10. The system according to claim 1, wherein the cooling medium is a liquid coolant.

\* \* \* \* \*